United States Patent
Porcelli et al.

(10) Patent No.: US 11,056,326 B2
(45) Date of Patent: Jul. 6, 2021

(54) SINTERED NON-POROUS CATHODE AND SPUTTER ION VACUUM PUMP CONTAINING THE SAME

(71) Applicant: Saes Getters S.p.A., Lainate (IT)

(72) Inventors: Tommaso Porcelli, Milan (IT);
Fabrizio Siviero, Lainate (IT);
Alessandro Gallitognotta, Origgio (IT)

(73) Assignee: Saes Getters S.p.A., Lainate (IT)

(*) Notice: Subject to any disclaimer, the term of this patent is extended or adjusted under 35 U.S.C. 154(b) by 375 days.

(21) Appl. No.: 16/068,803

(22) PCT Filed: Feb. 15, 2017

(86) PCT No.: PCT/EP2017/053407
§ 371 (c)(1),
(2) Date: Jul. 9, 2018

(87) PCT Pub. No.: WO2017/140730
PCT Pub. Date: Aug. 24, 2017

(65) Prior Publication Data
US 2019/0051504 A1 Feb. 14, 2019

(30) Foreign Application Priority Data
Feb. 19, 2016 (IT) .......................... UB2016A000885

(51) Int. Cl.
*H01J 41/20* (2006.01)
*F04B 37/04* (2006.01)
(Continued)

(52) U.S. Cl.
CPC ............ *H01J 41/20* (2013.01); *C23C 14/165* (2013.01); *F04B 37/04* (2013.01); *F04B 37/14* (2013.01);
(Continued)

(58) Field of Classification Search
CPC . H01J 41/20; H01J 41/12; F04B 37/04; F04B 37/14; F05D 2300/133; F05D 2300/134; F05D 2300/611; C23C 14/165
(Continued)

(56) References Cited

U.S. PATENT DOCUMENTS

| | | | |
|---|---|---|---|
| 3,542,488 A | 11/1970 | Hall | |
| 4,097,195 A * | 6/1978 | Hill | H01J 41/20 313/553 |

(Continued)

FOREIGN PATENT DOCUMENTS

GB 1171141 11/1969

OTHER PUBLICATIONS

Influence of the cathode materials on the sorption of noble gases by sputter-ion pumps (Year: 2015).*
(Continued)

*Primary Examiner* — Essama Omgba
*Assistant Examiner* — Christopher J Brunjes
(74) *Attorney, Agent, or Firm* — Oblon, McClelland, Maier & Neustadt, L.L.P.

(57) ABSTRACT

The present invention relates to cathodes electrodes compositions suitable to provide a pumping mechanism which exhibits an extremely high pumping speed and capacity of noble gas suitable to be used in several vacuum devices as for example sputter ion vacuum pumping systems comprising them as active element.

20 Claims, 2 Drawing Sheets

(51) Int. Cl.
*C23C 14/16* (2006.01)
*F04B 37/14* (2006.01)

(52) U.S. Cl.
CPC .. *F05D 2300/133* (2013.01); *F05D 2300/134* (2013.01); *F05D 2300/611* (2013.01)

(58) Field of Classification Search
USPC ..................................... 417/48–51
See application file for complete search history.

(56) References Cited

U.S. PATENT DOCUMENTS

| | | | | |
|---|---|---|---|---|
| 6,509,588 | B1* | 1/2003 | O'Phelan | A61N 1/3956 257/209 |
| 2006/0045754 | A1* | 3/2006 | Lukens | G01R 33/30 417/49 |
| 2014/0338795 | A1* | 11/2014 | Gloriant | A61L 27/06 148/217 |

OTHER PUBLICATIONS

International Search Report and Written Opinion dated May 15, 2017, in PCT/EP2017/053407, filed Feb. 15, 2017.
Written Opinion of the International Preliminary Examining Authority dated Jan. 23, 2108, in PCT/EP2017/053407, filed Feb. 15, 2017.
International Preliminary Report on Patentability dated May 3, 2018, in PCT/EP2017/053407, filed Feb. 15, 2017.
Porcelli, T. et al., "Influence of the cathode materials on the sorption of noble gases by sputter-ion pumps", Vacuum, vol. 122, XP 029299920, 2015, pp. 218-221.
Yoshimura, N. et al., "Ar-pumping characteristics of diode-type sputter ion pumps with various shapes of Ta/Ti" cathode pairs, Journal of Vacuum Science and Technology, vol. 10, No. 3, XP 055294123, 1992, pp. 553-555 with bibliographic page.

* cited by examiner

SINTERED NON-POROUS CATHODE AND SPUTTER ION VACUUM PUMP CONTAINING THE SAME

The present invention relates to cathodes electrodes compositions suitable to provide a pumping mechanism which exhibits an extremely high pumping speed and capacity of noble gas for several vacuum applications.

STATE OF THE ART

Since the 1950s, Sputter-Ion Pumps (SIPs) have been employed as an efficient and reliable way to maintain high vacuum (HV) or ultra-high vacuum (UHV) conditions (i.e., pressures lower than $10^{-5}$ mbar and $10^{-9}$ mbar, respectively) in a wide range of technological applications.

In its simplest configuration, which is commonly referred to as "diode" pump, a SIP consists of a vacuum envelope enclosing an array of stainless-steel cylindrical anodes placed between two Ti cathode plates. Its working principle relies on the simultaneous application of an electric and a magnetic field, whose combined action results in the ionisation of the residual gas inside the pump. Gas ions with a high kinetic energy can be subsequently pumped in both cathodes and anodes by means of several different chemisorption or physisorption mechanisms.

SIPs are able to efficiently pump most of the gas species and they are particularly effective in the sorption of chemically-reactive gases (e.g., $N_2$, CO, $CO_2$). However, their use may imply also a number of drawbacks determined by their working mechanisms.

First of all, pumping speed of a SIP is not constant but varies over its range of working pressures. It usually increases from lower pressure until about 10-6 mbar and then it starts to decrease as pressure keeps growing.

At the same time, a consistent pumping speed reduction is typical also at low pressure and in particular with $H_2$, which is the main residual gas in UHV systems.

Another critical aspect of a conventional diode SIP is represented by the sorption of noble gases with a special focus on Ar—which is the most common among them in air—whose pumping speed is generally only 2-5% of the nominal $N_2$ pumping speed. Moreover, the sorption of relatively small quantities of Ar by a diode SIP may lead to the onset of the so-called argon instability, an undesired phenomenon consisting in periodical pressure bursts caused by the sudden release of previously-pumped Ar from the cathodes. This limit was bypassed thanks to the development of the so-called "noble-diode" SIPs, in which the use of two different cathodes (for example one cathode made in titanium and one in tantalum) reduces the argon-instability problem and ensures a higher Ar pumping speed. Nevertheless, this improvement is possible only to the detriment of the sorption rates of chemically-reactive gases, which are reduced by 15-20%. Except for Ta—Ti noble-diode SIPs, however, none of these proposed solutions relying on other cathode materials has never been implemented in any commercial product. Improvements in the SIP technology came instead from geometry modifications of the pump and, in particular, of the electrodes: "triode" SIPs are a significant example of this.

The pumping of noble gases (which is one of the main SIP tasks when used in combination with one or more Non-Evaporable getter (NEG) pump) is particularly critical, due to the above-mentioned limitations of diode and noble-diode SIPs. In systems operating under typical UHV conditions, the gas load due to the non-getterable gases comprises a small percentage of the total pressure and therefore it does not affect the pumping performance of a SIP throughout its working lifetime. However, some applications might require to deal with larger loads of non-getterable gases (e.g., portable mass spectrometers, helium ion microscopes, inductively coupled plasma mass spectroscopes).

Apart from argon instability, during its functioning a SIP is in general prone to the undesired regurgitation of previously-sorbed gases from its inner surfaces. The regurgitation of previously-pumped gases (both getterable and non-getterable) during the functioning of a SIP is also challenging in view of the synergic combination with a NEG pump. This is mostly true in the case of $CH_4$, which is not pumped by NEG but whose ionization by a SIP produces $H_2$, which is instead a getterable gas. From this point of view, the gas quantities released by the SIP that the NEG pump can shoulder prior to reach its maximum capacity become an important aspect that should not be neglected during the characterization of the pumping system (i.e. the system comprising at least a SIP and a NEG pump or cartridge).

In the past decades many efforts have been done about the evaluation of the possibility to vary the cathode materials of diode SIPs, in order to improve their pumping efficiency for some gases of interest without being forced to geometry modifications that inevitably involve technical and economical drawbacks in their manufacturing. Since the earliest investigations on SIP technology, Ti has been identified as the most suitable cathode material, both due to its chemical reactivity as well as to its availability and price. Other materials were also examined, including Mg, Fe, Al, Mo, and Cu, but Ti was found to be clearly superior in terms of pumping speed provided for air.

U.S. Pat. No. 3,147,910 disclosed a vacuum pump apparatus comprising porous pumping bodies as cathode electrodes that were composed of titanium or zirconium particles bonded by heating. Said cathode electrodes have an extremely high molecular hydrogen absorption rate but maintain the drawbacks related to the limited noble gas pumping efficiency and undesired regurgitation of previously sorbed gases other than $H_2$.

Patent specification number GB 1,035,201 disclosed vacuum devices comprising one or more self-supporting sintered sorbing members formed of tungsten in combination with at least one active metal selected among titanium, hafnium, zirconium and thorium. GB 1,035,201 describes the use of tungsten as necessary to improve the lifetime of the sintered sorbing member preventing their deformation or damage as effect of the exposition to high temperatures. However the sintered sorbing members described in GB 1,035,201 show some manufacturing drawbacks related to the high cost and the high melting point of tungsten and the patent is silent about the overcoming of other drawbacks as the limited noble gas pumping efficiency and the undesired regurgitation of previously sorbed gases.

U.S. Pat. No. 3,542,488 describes a sputter-ion pump having cathodes members, each one constructed from the assembly of at least two kind of different structural element having different metallic composition, as example in a said—called "grid fashion". U.S. Pat. No. 3,542,488 lists forty four different metallic elements and describes the effect of said assembled cathodes as an increase of sorption of active gases such as nitrogen, oxygen, water vapor and the like and discloses a geometrical solution complex if compared to standard bulk cathodes structures and having sorption performances that are inevitably affected by difficulties into control the alloying of two or more sputterable metals in the vapor phase.

DESCRIPTION OF THE INVENTION

It is a primary object of the present invention to provide cathodes useful to be used in a SIP or in other vacuum pumping elements for high or ultra-high vacuum applications and devices overcoming the above referred drawback of the state of the art.

It is further an object of the present invention to provide a SIP comprising said cathodes and having easily controllable sorption performances as well showing efficiency in noble gas sorption and limited undesired regurgitation of previously sorbed gases.

It is also an object of the present invention to provide a combined pumping system comprising at least one sputter-ion pumping component containing said cathodes.

In order to better understand the invention and appreciate its advantages, a number of non-limiting examples of embodiment are described below with reference to the attached drawings in which.

Figure 1:
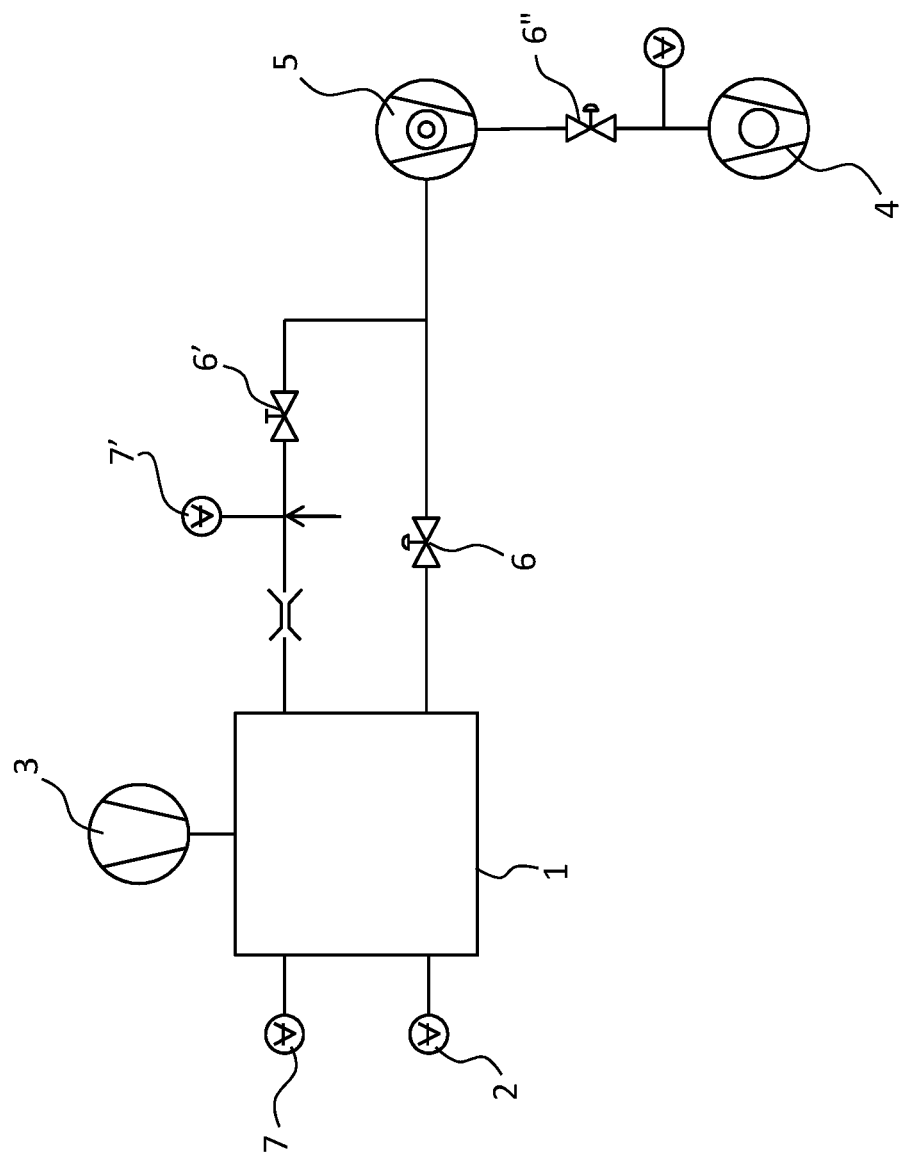
FIG. 1 shows a schematic layout of an experimental test-bench for the characterization of SIPs.

In accordance with a preferred embodiment, the present invention consists in a cathode having mean atomic mass W, said cathode being suitable to be used as electrode in a sputter ion pump and comprising in its chemical composition a sintered bulk mixture of at least two different metal elements M1 having atomic mass W1 in an amount q1 expressed as atomic percent of the total number of atoms Q of the cathode and M2 having atomic mass W2 in an amount q2 expressed as atomic percent of the total number of atoms Q of the cathode, wherein M1 and M2 are both selected among titanium (Ti), tantalum (Ta), zirconium (Zr), niobium (Nb), hafnium (Hf), rare earths, nickel (Ni) or molybdenum (Mo) and q1, q2, W1 and W2 are selected in such a way that the atomic mass of the cathode defined as $W=W1*q1+W2*q2$ is comprised in the range between 80 and 160 amu.

In a preferred embodiment according to the present invention, the cathode has mean atomic mass W comprised in the range between 80 and 160 amu, preferably between 100 and 160 amu. Said mean atomic mass W is defined as the sum of the atomic masses W1 and W2 respectively of the metallic elemental components M1 and M2 in the cathode chemical composition, each one weighted in function of their atomic percent respect to the overall number of atoms Q of the cathode. In other words, said mean atomic mass of the cathode is defined by the formula $W=W1*q1+W2*q2$.

According to the present invention the cathode consists in a bulk composite material made of two or more metal elements and at least two of them are selected in the list of titanium, tantalum, zirconium, niobium, hafnium, rare earths, nickel or molybdenum. More preferably said at least two metal elements are two selected among titanium, tantalum and zirconium.

In some specific embodiments according to the present invention the two different metal elements M1 and M2 selected among titanium, tantalum, zirconium, niobium, hafnium, rare earths, nickel or molybdenum can be mixed with one or more additional metallic elements different from M1 and M2, not strictly limited to the previous claimed list of metallic elements, in a cumulative amount lower than the 3% (atomic percentage) of the sintered bulk cathode. This limited amount of additional metallic elements, even if they comprise elements having a high atomic mass, only slightly affects the mean atomic mass W of the cathode that can be still approximated to the sum $W1*q1+W2*q2$ considering only M1 and M2. In addition to titanium, tantalum, zirconium, niobium, hafnium, rare earths, nickel or molybdenum, said additional elements can be selected among copper, aluminum, iron, cobalt.

Cathodes according to the present invention can be produced by Hot Uniaxial Pressure (HUP) sintering of powders. Alternative techniques suitable to be used to manufacture cathodes with the same advantages of the HUP process are Hot Isostatic Pressure (HIP) sintering and Metal Injection Moulding (MIM). The choice of the HUP, HIP or MIM techniques results in a new way of producing cathodes for SIPs, differently to other solutions proposed in the past. As a matter of fact, the HUP process allows to make couples of cathodes in which two different metals are homogeneously distributed, in contrast with the conventional noble-diode SIP layout, where a pure Ti cathode is opposed to a pure Ta one. If necessary, it also permits to increase the number of elements constituting each cathode, instead of using only two of them each time. Moreover, the atomic percentage of each element in the mixture to be sintered can be easily tuned in.

HUP sintering process, for example, consists in the simultaneous application of uniaxial pressure and heat to a mould containing the metal powders to be sintered. Hot pressing allows to greatly reduce porosity and to obtain bulk density; furthermore, it results in better mechanical properties and in a more uniform microstructure compared to conventional press or sintering processes. Furthermore, the HUP technique is a good way to produce a mixture of different materials with bulk density without using alloys, which instead would result in new compounds with different physical and chemical properties. In order to obtain the sintered non-porous bulk cathodes according to the present invention can be applied temperature comprised between 800 and 1200° C., uniaxial pressure between 40 and 100 bar/cm$^2$ for time lasting from 1 to 4 hours.

Cathodes according to the present invention and suitable to be used in a sputter ion pump configuration can be sintered and shaped without particular limitations, in function of the requirements related to the design of the final device in which said cathodes have to be included.

In a second aspect the present invention consist in a sputter-ion pump comprising the cathodes according to claim 1 as active pumping elements.

The present invention will be further explained by the following non-limiting examples.

Example 1—Cathodes According to the Present Invention

Some Pairs of Cathodes (S1 to S4) according to the present invention have been produced by HUP process selecting processing temperature generally ranged between several hundreds of Celsius degrees, while the applied uniaxial pressure was of the order of several tens of bar.

At the end of the HUP process, each cathode was grinded, if necessary, and carefully cleaned in an ultrasonic bath with an appropriate alkaline detergent (M-Aero-NS, Arm & Hammer). Afterwards, each pair of cathodes underwent an in-vacuo annealing thermal treatment, with the main aim of reducing the degassing rate of $H_2$. Different combinations of temperature and time length of annealing have been tested.

Table 1 resumes the tested configurations and the corresponding thermal treatments.

TABLE 1

| Sample | Pair of Cathodes | Temperature | Time length | Mean atomic mass [amu] |
| --- | --- | --- | --- | --- |
| S1 | $Ta_{35}Ti_{65}$ | 800° C. | 3 h | 94.455 |
| S2 | $Ta_{50}Ti_{50}$ | 1100° C. | 72 h | 114.415 |
| S3 | $Ta_{35}Zr_{65}$ | 1100° C. | 72 h | 122.628 |
| S4 | $Ta_{50}Zr_{50}$ | 1100° C. | 72 h | 136.087 |

In Table 1 the subscript number associated with each element of the pair show the atomic ratio of that pair. For example, in Sample 1 the ratio 35:65 shows the ratio of Tantalum to Titanium.

Example 2—Cathodes not According to the Present Invention

A first set of Cathodes not according to the present invention useful to give evidence of the technical effect are commercial electrodes (plate-shaped) made of only Titanium, only Zirconium or only Tantalum.

A second set of sintered cathodes not according to the present invention have been produced by HUP process using powders of a single metal (C2) or a mixture of powders of Zirconium and Titanium having a mean atomic mass outside the claimed range (C4).

Table 2 resumes the considered configurations and the corresponding thermal treatments when cathodes produced by HUP process have been used.

In particular, a standard diode configuration with titanium commercial cathodes (C1) has been considered as well as the same configuration using cathodes made only in titanium by HUP process of powders (C2). Noble diode configurations have been considered pairing commercials cathodes of tantalum and titanium (C5).

TABLE 2

| Sample | Pair of Cathodes | Temperature | Time length | Mean atomic mass [amu] |
| --- | --- | --- | --- | --- |
| C1 | Ti—Ti (diode) | n.a. | n.a. | 47.880 |
| C2 | Ti—Ti (HUP) | 600° C. | 3 h | 47.880 |
| C3 | Ta—Zr (noble diode) | n.a. | n.a. | 136.087 |
| C4 | $Zr_{50}Ti_{50}$ (HUP) | 1100° C. | 40 min | 69.552 |
| C5 | Ta—Ti (noble-diode) | n.a. | n.a. | 114.415 |

Example 3—Comparison of Noble Gas Sorption Performances

An experimental test-bench having schematic layout of FIG. 1 has been used for the characterization of SIPs. The system is made of a main vacuum vessel 1, with a volume of 26.7 l, where a Pfeiffer Prisma Plus quadrupole mass spectrometer 2 for residual gas analyses and the SIP 3 under test are installed.

The entire system is pumped by an Edwards XDS 10 scroll pump 4 connected in series to a Pfeiffer Vacuum HiPace 300 turbomolecular pump 5, which provides a nominal pumping speed of 260 l/s for $N_2$. Gas leakage into the system is controlled by automatic valves built in-house 6, 6', 6". Two hot-cathode Bayard-Alpert gauges Granville-Phillips 360/370 Stabil-Ion® 7, 7' are placed in proximity of the gas inlet 8 and in the main volume near SIP 3 and QMS 2, respectively. Their working pressure range is $10^{-2}$ Torr to $10^{-10}$ Torr.

After every venting necessary for the installation of a new SIP to be characterized and prior to make whichever sorption test, the entire vacuum system is baked by means of an ad hoc oven. The injection line and the SIP to be tested, without magnets, are also baked. The adopted procedure includes a 10 h long bake-out at 180° C., which is sufficient to reach base pressures typically in the $10^{-10}$-$10^{-9}$ Torr range.

Figure 3:
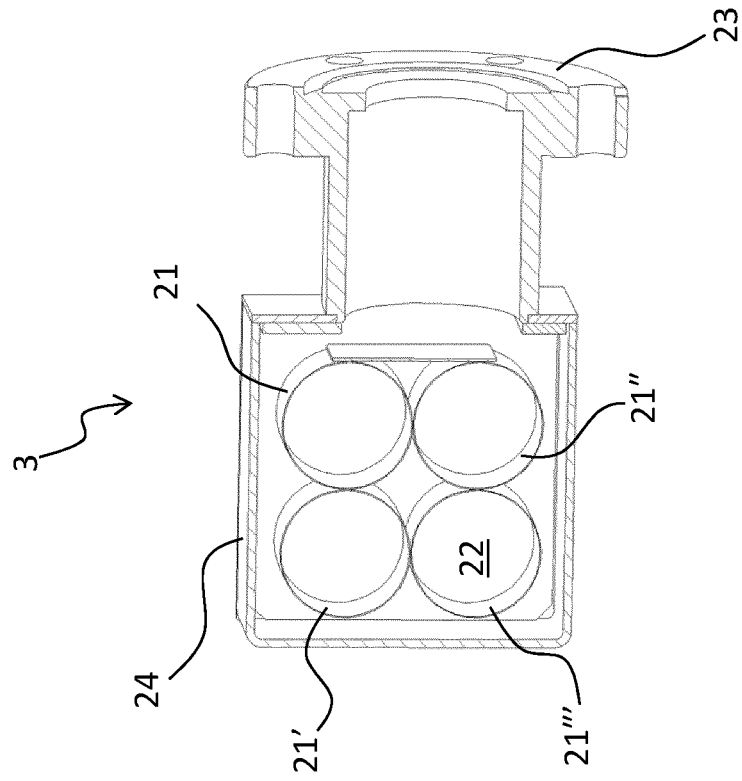
FIG. 3 is a cross section view of an assembled pump showing the electrodes in the possible embodiment of FIG. 2 therein.
Figure 2:
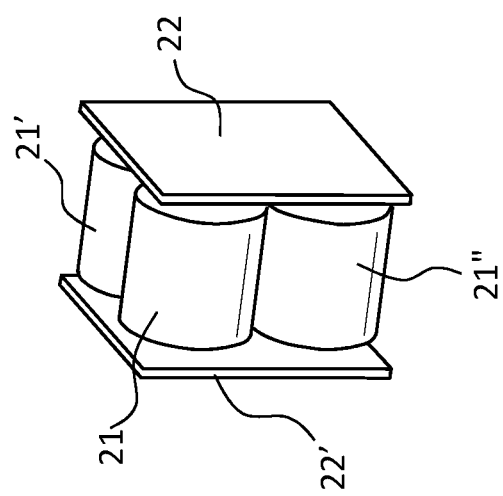
FIG. 2 shows a schematic layout of the electrodes in a possible embodiment of the invention.

A schematic layout of the electrodes in the assembled pumps is shown in FIG. 2. It comprises an array of four identical cylindrical anodes 21, 21', 21", 21''' made of stainless steel located between two cathode plates 22, 22': the dimensions of the stainless-steel vacuum envelope enclosing the electrodes are 60×62×42 mm. The cross section view of the assembled pumps showing the electrodes embodiment of FIG. 2 therein is shown in FIG. 3. are connected to the vacuum system through a CF35 flange 23 and magnets are placed outside the vacuum envelope 24, in correspondence of the cathodes 22, 22'.

TABLE 3

| Sample | Cathodes | Ar pumping speed l/s | Ne pumping speed l/s |
| --- | --- | --- | --- |
| S1 | $Ta_{35}Ti_{65}$ | 0.91 | 0.71 |
| S2 | $Ta_{50}Ti_{50}$ | 1.00 | 0.78 |
| S3 | $Ta_{35}Zr_{65}$ | 1.20 | 0.87 |
| S4 | $Ta_{50}Zr_{50}$ | 1.14 | 0.89 |
| C1 | Ti—Ti | 0.29 | 0.37 |
| C2 | Ti—Ti | 0.18 | 0.25 |
| C3 | Ta—Zr | 0.94 | 0.80 |
| C4 | $Zr_{50}Ti_{50}$ | 0.56 | 0.55 |
| C5 | Ta—Ti | 0.72 | 0.71 |

Experimental results showed in table 3 clearly show that all the samples according to present invention (S1 to S4) have performances higher than the corresponding pairs of cathodes in which each cathode is made of one of the two components of the HUP cathodes (S1 and S2 vs C5, S3 and S4 vs C3). (C1, C3), On the contrary, the use of HUP process with powders of only a single metal (C2) has shown to jeopardize the sorption performance if compared to the configuration with commercial cathodes of the same metal (C1).

Samples according to the invention (S1 to S4) have shown a better performance respect to the use of HUP cathodes made with mixed powders of two metals and having mean atomic mass outside the claimed one (C4): the improvements obtained with the invention allow to achieve noble gas sorption performances comparable or superior to noble diode configuration (C5) but without requiring complex modifications of the structure of the pumping device, i.e. maintaining the "simple" structure of the "diode" sputter ion pump.

The invention claimed is:
1. A cathode comprising:
 a molded sintered bulk mixture of a powder of a first metal M1;
 a powder of a second metal M2, which is different from M1; and
 optionally, a powder of one or more metallic elements, which are different from M1 and M2;
 wherein
 the powders M1, M2 and one or more metallic elements different from M1 and M2 are homogeneously distributed in the sintered bulk mixture,
 the molded sintered bulk mixture is nonporous, a content of the one or more metallic elements is less than 3 atonic %, based on a total number of atoms Q of the sintered bulk mixture, wherein M1 and M2 are each independently selected from a group consisting of titanium (Ti), tantalum (Ta), zirconium (Zr), niobium (Nb), hafnium (Hf), a rare earth metal, nickel (Ni), and molybdenum (Mo), and wherein M1 and M2 have a mean atomic mass W in a range of 80 to 160 amu according to the formula $$W=W1*q1+W2*q2$$

wherein M1 has an atomic mass W1 in an amount q1 expressed as an atomic percent of the total number of atoms Q of the sintered bulk mixture and M2 has atomic mass W2 in an amount q2 expressed as an atomic percent of the total number of atoms Q.

2. The cathode of claim 1, wherein W is in a range of 100 to 160 amu.

3. The cathode of claim 2, wherein M1 and M2 are Ta and Ti respectively and a ratio of Ta/Ti is 50 parts Ta to 50 parts Ti.

4. The cathode of claim 2, wherein M1 and M2 are Ta and Zr respectively and a ratio of Ta/Zr is 35 parts Ta to 65 parts Zr.

5. A sputter-ion pump system comprising as active pumping elements at least two of the non-porous cathodes of claim 4.

6. The cathode of claim 2, wherein M1 and M2 are Ta and Zr respectively and a ratio of Ta/Zr is 50 parts Ta to 50 parts Zr.

7. A sputter-ion pump system comprising as active pumping elements at least two of the non-porous cathodes of claim 2.

8. The cathode of claim 1, wherein the one or more metallic elements, which are each different from M1 and M2, are each independently selected from the group consisting of aluminum, copper, titanium, tantalum, zirconium, niobium, molybdenum, nickel, a rare earth metal, hafnium, iron, cobalt, and vanadium.

9. A sputter-ion pump system comprising as active pumping elements at least two of the non-porous cathodes of claim 8.

10. The cathode of claim 1, wherein M1 and M2 are each independently selected from the group consisting of titanium, tantalum, and zirconium.

11. A sputter-ion pump system comprising as active pumping elements at least two of the non-porous cathodes of claim 10.

12. A sputter-ion pump system comprising as active pumping elements at least two of the non-porous cathodes of claim 1.

13. The cathode of claim 1, wherein M1 and M2 are Ta and Ti respectively and a ratio of Ta/Ti is 35 parts Ta to 65 parts Ti.

14. A sputter-ion pump system comprising as active pumping elements at least two of the non-porous cathodes of claim 13.

15. The cathode of claim 1, wherein M1 and M2 are Ta and Ti respectively and a ratio of Tall is 50 parts Ta to 50 parts Ti.

16. A sputter-ion pump system comprising as active pumping elements at least two of the non-porous cathodes of claim 15.

17. The cathode of claim 1, wherein M1 and M2 are Ta and Zr respectively and a ratio of Ta/Zr is 35 parts Ta to 65 parts Zr.

18. A sputter-ion pump system comprising as active pumping elements at least two of the non-porous cathodes of claim 17.

19. The cathode of claim 1, wherein M1 and M2 are Ta and Zr respectively and a ratio of Ta/Zr is 50 parts Ta to 50 parts Zr.

20. A sputter-ion pump system comprising as active pumping elements at least two of the non-porous cathodes of claim 19.

* * * * *